(12) United States Patent
Steffens et al.

(10) Patent No.: US 7,260,136 B2
(45) Date of Patent: Aug. 21, 2007

(54) MULTIPLE LASER CAVITY

(75) Inventors: Wolf Steffens, Herrenberg (DE); Ulrich Kallmann, Tubingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 350 days.

(21) Appl. No.: 10/500,627

(22) PCT Filed: Feb. 22, 2002

(86) PCT No.: PCT/EP02/01886

§ 371 (c)(1),
(2), (4) Date: Feb. 11, 2005

(87) PCT Pub. No.: WO03/071640

PCT Pub. Date: Aug. 28, 2003

(65) Prior Publication Data

US 2005/0128563 A1 Jun. 16, 2005

(51) Int. Cl.
*H01S 3/08* (2006.01)
(52) U.S. Cl. .......................................... 372/92; 372/98
(58) Field of Classification Search ................ 372/94, 372/92
See application file for complete search history.

(56) References Cited

U.S. PATENT DOCUMENTS 3,610,731 A * 10/1971 Seidel ........................ 359/243
4,979,178 A 12/1990 Beausoleil et al. ........... 372/20
5,420,683 A * 5/1995 Hall ............................ 356/467
5,594,744 A 1/1997 Lefevre et al. ................ 372/20
6,130,899 A 10/2000 Epworth et al. ................ 372/6
6,252,718 B1 6/2001 Lefevre ....................... 359/633
2001/0010599 A1 8/2001 Lefevre ....................... 359/633

FOREIGN PATENT DOCUMENTS

EP 0 112 140 9/1983
EP 1 113 371 4/2001
EP 1 113 372 4/2001

OTHER PUBLICATIONS

Takahashi et al., "Multiwavelength Ring Laser Composed of EDFAs and an Arrayed-Wavelength Multiplexer", Electronics Letters, vol. 30, No. 1, Jan. 1994, pp. 44-45.

* cited by examiner

*Primary Examiner*—Armando Rodriguez

(57) ABSTRACT

A method of using at least a part of a cavity for a first and at least one second laser includes providing a first laser beam to the part of the cavity, splitting the first beam into a first and a second part, splitting the first part into a third and a fourth part, splitting the second part into a fifth and a sixth part, superimposing the third and the fifth part in a way causing extinguishing interference, superimposing the fourth and the sixth part in a way causing cumulative interference to provide a first resulting beam, and performing the above elements with at least one second laser beam provided to the same part of the cavity to provide a second resulting beam.

18 Claims, 4 Drawing Sheets

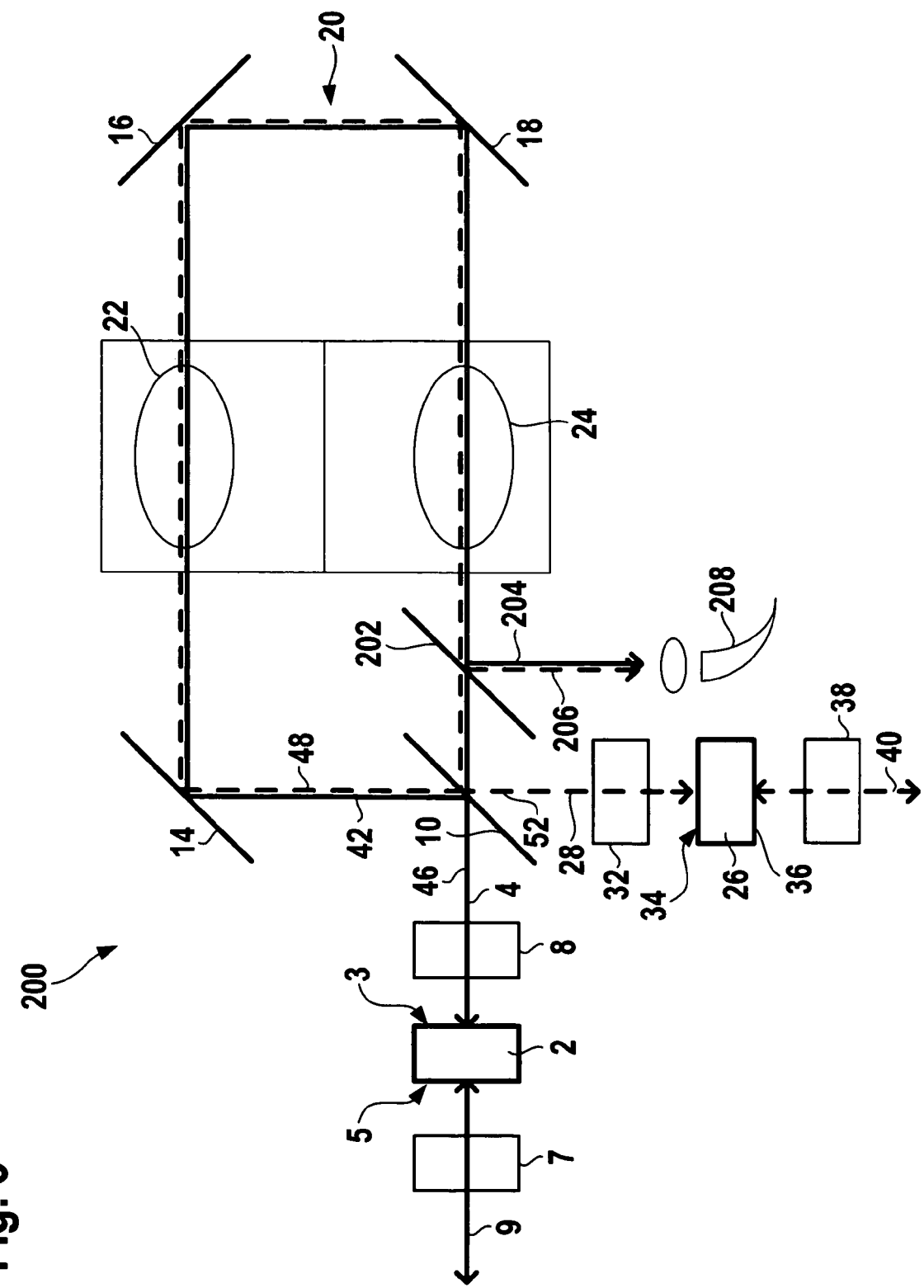

MULTIPLE LASER CAVITY

This application is the National Stage of International Application No. PCT/EP02/01886, International Filing Date, Feb. 22, 2002, which designated the United States of America, and which international application was published under PCT Article 21(2) as WO Publication No. WO 03/071640 A1.

BACKGROUND OF THE INVENTION

The present invention relates to laser cavities. Such optical cavities resonated by a laser source, i.e. a laser diode, can select one or more wavelengths emitted by a laser amplifier medium. Known cavities frequently comprise two mirrors, one constituting a cavity end element and the other constituting a tuning element for tuning the laser. For providing a single mode laser the cavity furthermore can contain a wavelength filter, e.g. a diffraction grating, for selecting a certain wavelength. Cavities containing such a filter can be built up according to the Littrow- or the Littman-configuration as disclosed in U.S. Pat. No. 5,594,744 or in U.S. Pat. No. 6,252,718, for example.

SUMMARY OF THE INVENTION

Therefore, it is an object of the invention to provide an improved laser. The object is solved by the independent claims. Other preferred embodiments are shown by the dependent claims.

An advantage of the present invention is the possibility to use just one cavity for amplifying two or more laser beams or being driven by two or more laser beams. Therefore, the costly investment of the cavity can be utilized in an economic way for two or more lasers.

In a preferred embodiment of the invention there are provided two laser beams to the part of the cavity and at least one part of each of the laser beams is forced to travel a closed loop within the part of the cavity. It is further preferred to split the at least one laser beam into a first and a second part and to force each part of the at least one laser beam to travel a closed loop within the part of the cavity, preferably travel the same loop within the part of the cavity. It is even more preferred to let each part of the at least one laser beam travel the same loop and preferably to travel the same loop in opposite direction.

BRIEF DESCRIPTION OF THE DRAWINGS

Other objects and many of the attendant advantages of the present invention will be readily appreciated and become better understood by reference to the following detailed description when considering in connection with the accompanied drawings. The components in the drawings are not necessarily to scale, emphasis instead being placed upon clearly illustrating the principles of the present invention. Features that are substantially or functionally equal or similar will be referred to with the same reference sign(s).

FIG. 1-5 show preferred embodiments of the present invention.

DETAILED DESCRIPTION OF THE INVENTION

Figure 1:
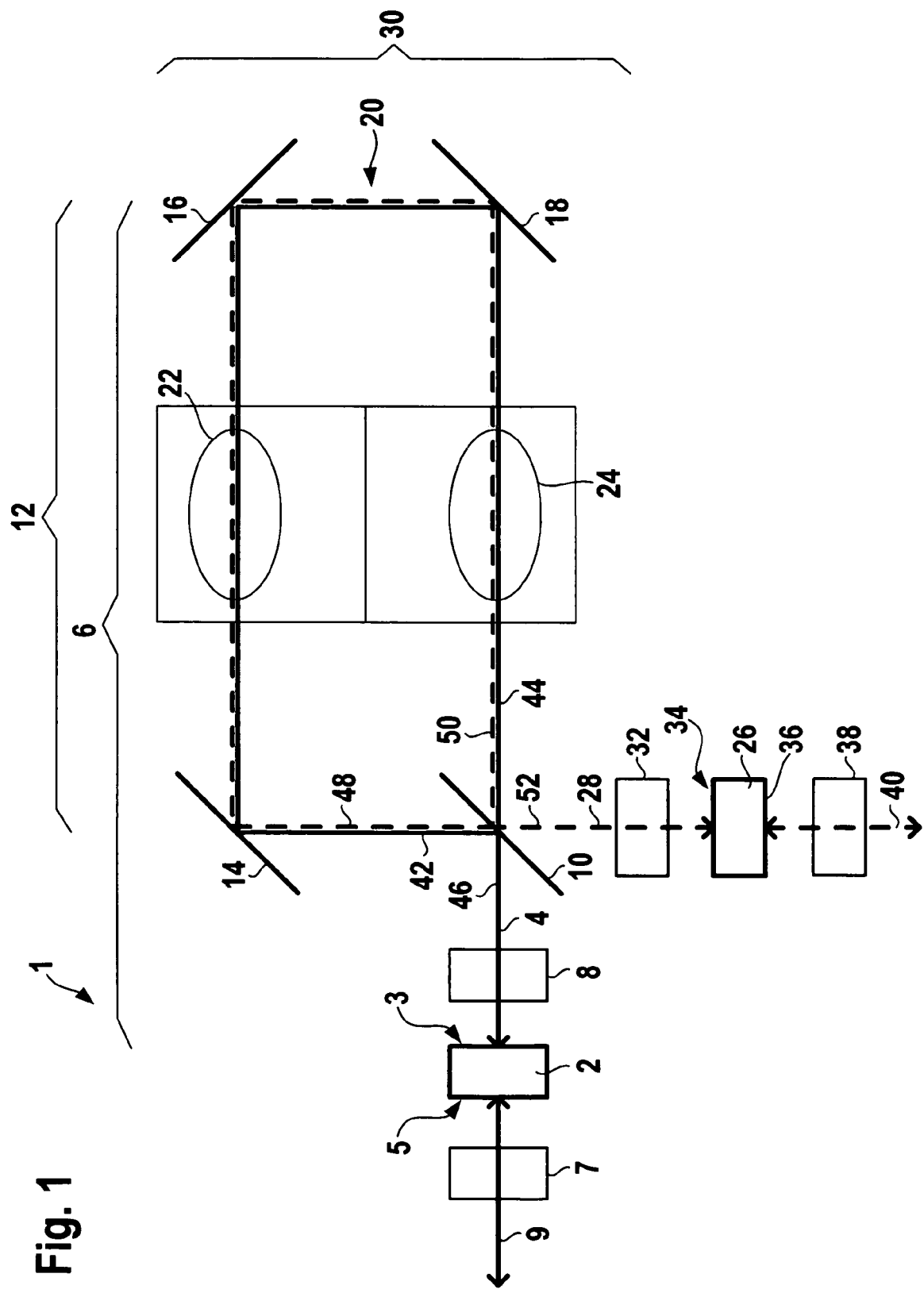

Referring now in greater detail to the drawings, FIG. 1 shows a first preferred embodiment 1 of the present invention in a schematic illustration. Embodiment 1 comprises a first laser diode 2 emitting a first laser beam 4 into an external cavity 6. A collimator 8 collimates the laser beam 4 onto a about 50:50 beam splitter 10. Laser diode 2 is treated to have nearly no reflection at the end facet 3. At the side 5 of the laser diode 2 opposite to the anti-reflective facet 3 laser diode 2 emits through a collimator 7 a laser beam 9 amplified by resonating in the cavity 6.

The beam splitter 10 is an element of a part 12 of the cavity 6. The part 12 further comprises three mirrors 14, 16 and 18. Together with the mirrors 14, 16, 18 beam splitter 10 constitutes a closed loop 20 in part 12. Two of the mirrors 14, 16, 18, the mirrors 16 and 18 can be self aligning or can constitute a dihedral 101 as shown in embodiment 100 of FIG. 2, alternatively.

Part 12 preferably further comprises two filters 22, 24 in the path of the closed loop 20 for selecting a certain wavelength. Alternatively, it is possible to use only one filter (not shown in the figures) in the path instead of the two filters 22 or 24.

Figure 2:
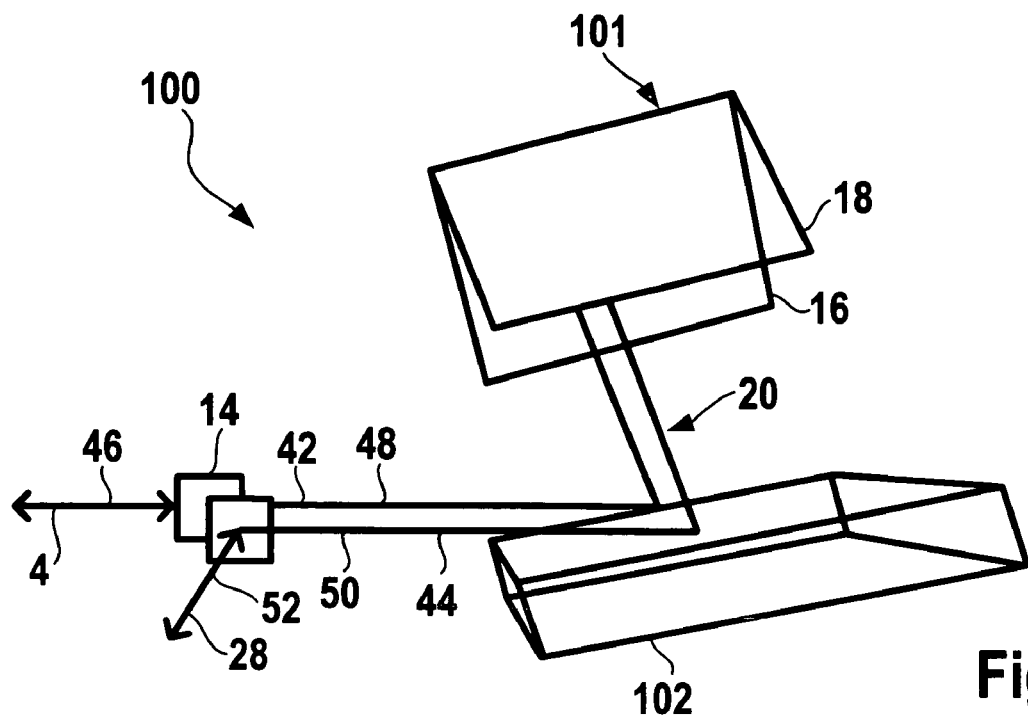

Filters 22, 24 can, for example, be a diffraction grating 102 as shown in embodiment 100 of FIG. 2 and the cavity 6 can be constructed according to the Littman-configuration as shown in embodiment 100 of FIG. 2. For further details of the Littman-configuration see European patent applications EP-A-0 112 140, EP-A-01 113 371.7 and EP-A-01 113 372.5 of the applicant, the disclosure of which is incorporated herein by reference. However, the filters 22, 24 may also represent any other filtering device to be coupled into the closed loop.

Furthermore, embodiment 1 comprises a second laser diode 26 providing a second laser beam 28 to an external cavity 30. Part 12 is part of the cavity 30, also. Therefore, the above description of the part 12 applies here, also.

A collimator 32 collimates the laser beam 28 onto the beam splitter 10. Laser diode 26 is treated to have nearly no reflection at the end facet 34 and serves as a cavity end element for the cavity 30. At the side 36 of the laser diode 26 opposite to the anti-reflective facet 34 laser diode 26 emits through a collimator 38 a laser beam 40 amplified by resonating in the cavity 30.

The gain media 2 and 26 can have the same wavelength spectrum but can also cover different wavelength regions. In FIG. 1, the gain medium 2 comprises the C- and the L-band and the gain medium 26 comprises the S-band.

The inventive method works as follows:

The laser beam 4 provided by the laser diode 2 is split by the beam splitter 10 into a first part 42 and a second part 44. The first part 42 is traveling through the loop 20 being reflected by mirrors 14, 16 and 18 back onto beam splitter 10. Then, beam splitter 10 splits the first part 42 into a third part and a fourth part. Simultaneously, the second part 44 travels through the loop 20 in opposite direction being reflected by mirrors 18, 16 and 14 and hits the beam splitter 10 from the other side. Then, beam splitters 10 splits the second part 44 into a fifth and a sixth part.

By beam splitter 10 the third and the fifth part are superimposed causing extinguishing interference. Therefore, no light leaves beam splitter 10 in the direction to the laser diode 26. However, beam splitter 10 superimposes the fourth and the sixth part causing cumulative interference. Therefore, a first resulting beam 46 leaves the beam splitter 10 in the direction to the laser diode 2. While traveling along the closed loop 20 parts 42 and 44 each are filtered two times by the filters 22 and 24 for selecting a desired wavelength of the laser beam 46. Accordingly, laser diode 2 emits through side 5 and collimator 7 the resulting amplified laser beam 9.

The same as above goes for the laser beam 28. Laser beam 28 is split by the beam splitter 10 into a first part 48 and a second part 50. Parts 48 and 50 are depicted in FIG. 1 parallel to parts 42 and 44 for illustrative purposes, only. Actually, parts 48 and 50 are coaxial with parts 42 and 44, respectively. Part 48 travels through the closed loop 20 by being reflected by mirrors 14, 16 and 18 and then being split by the beam splitter 10 into a third and a fourth part. Part 50 travels the opposite direction through the closed loop 20, hits the beam splitter 10 from the other side and is being split by the beam splitter 10 in a fifth and a sixth part. At beam splitter 10 the third and the fifth part are superimposed causing extinguishing interference. At beam splitter 10 the fourth and the sixth part are superimposed causing cumulative interference providing a second resulting beam 52. Again, by filters 22 and 24 both parts 48 and 50 each are filtered two times and therefore a certain wavelength is selected for the laser beam 52. Accordingly, laser diode 26 emits through side 36 and collimator 38 the resulting amplified laser beam 40.

FIG. 3 shows another embodiment 200 of the apparatus according to the invention. In embodiment 200 a second beam splitter 202 is introduced into the loop 20. With the second beam splitter 202 laser light 204 originating from laser 4 and laser light 206 originating from laser 28 can be extracted from the loop 20. Light 204 and 206 has been filtered by filters 22 and 24 but has not entered laser diodes 2 and 26 again. Therefore, laser beams 204 and 206 contain less source spontaneous emission (SSE) of the diodes 2 and 26, i.e. the beams 204 and 206 providing low SSE laser light 204, 206 which then can be provided to an optical fiber 208 and can be used in performing high resolution optical measurements needing low SSE laser light.

Figure 4:
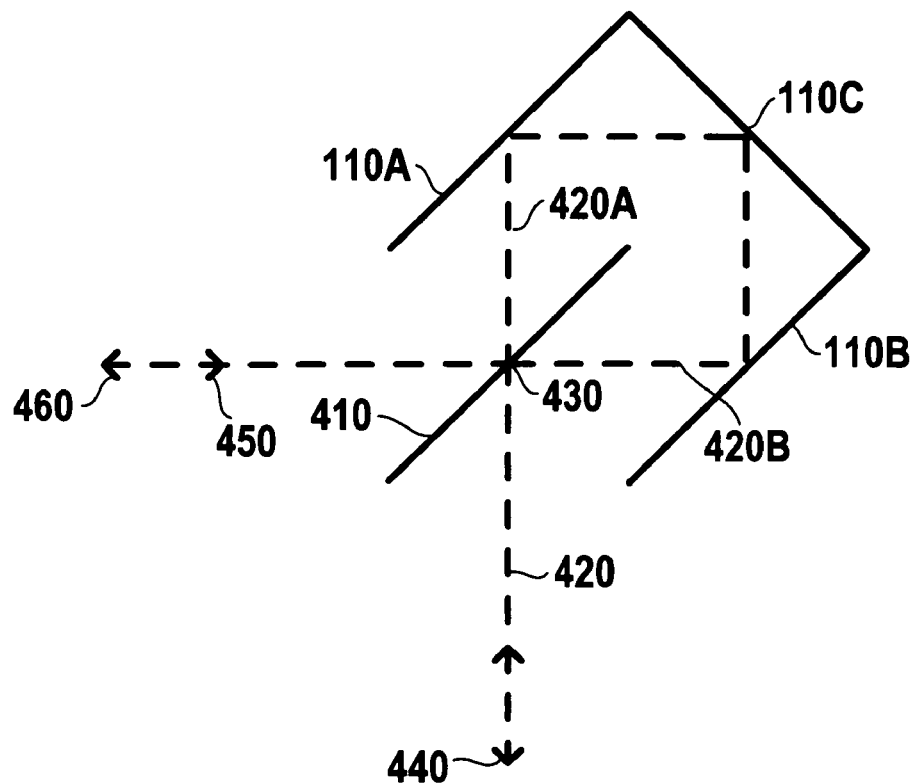

FIG. 4 shows an alternative embodiment of a cavity 400 driven by two lasers. The cavity 400 is provided by a beam splitter 410 and three plates 110A, 110B and 110C. The plates 110A and 110B are arranged parallel to each other, and the third plate 110C is arranged perpendicular to the two parallel plates 110A and 110B, preferably abutting to the sides of the parallel plates 110A and 110B. The beam splitter 410 is arranged with respect to a first incident beam 420 that one partial beam 420A transmitted through the beam splitter 410 and another partial beam 420B reflected by the beam splitter 410 travel the same path (but with opposite directions) within the cavity 400 and eventually meet at the same position 430 where the first incident beam 420 hit the beam splitter 410. The beam splitter 410 is therefore arranged substantially in parallel to the parallel plates 110A and 110B.

In operation, the incident light beam 420 is split up by the beam splitter 410 (having a splitting ratio of 50:50) into the partial beams 420A and 420B, so that 50% of the incident beam 420 is reflected and 50% is transmitted. The transmitted partial beam 420A is reflected by the first parallel plate 110A, the perpendicular plate 110C, and the second parallel plate 110B and eventually reaches again the position 430. Accordingly, the transmitted partial beam 420B is reflected by the second parallel plate 110B, the perpendicular plate 110C, and the first parallel plate 110A and also eventually reaches again the position 430. Since both partial beams 420A and 420B have traveled substantially the same path and meet at the same position 420, the partial beams 410A and 410B will constructively interfere to a first output beam 440, while an output beam leaving to the left of the beam splitter 410 is canceled by destructive interference.

A second incident light beam 450 provided from the other side (left) of the beam splitter 410 will be proceeded accordingly, so only one output beam 460 in return to the second incident light beam 450 will be provided, whereby the output beam 460 travels the same path as the second incident light beam 450 but with opposite propagation direction.

It goes without saying that additional elements can be inserted into the cavity 400, e.g. for wavelength-filtering etc.

Figure 5:
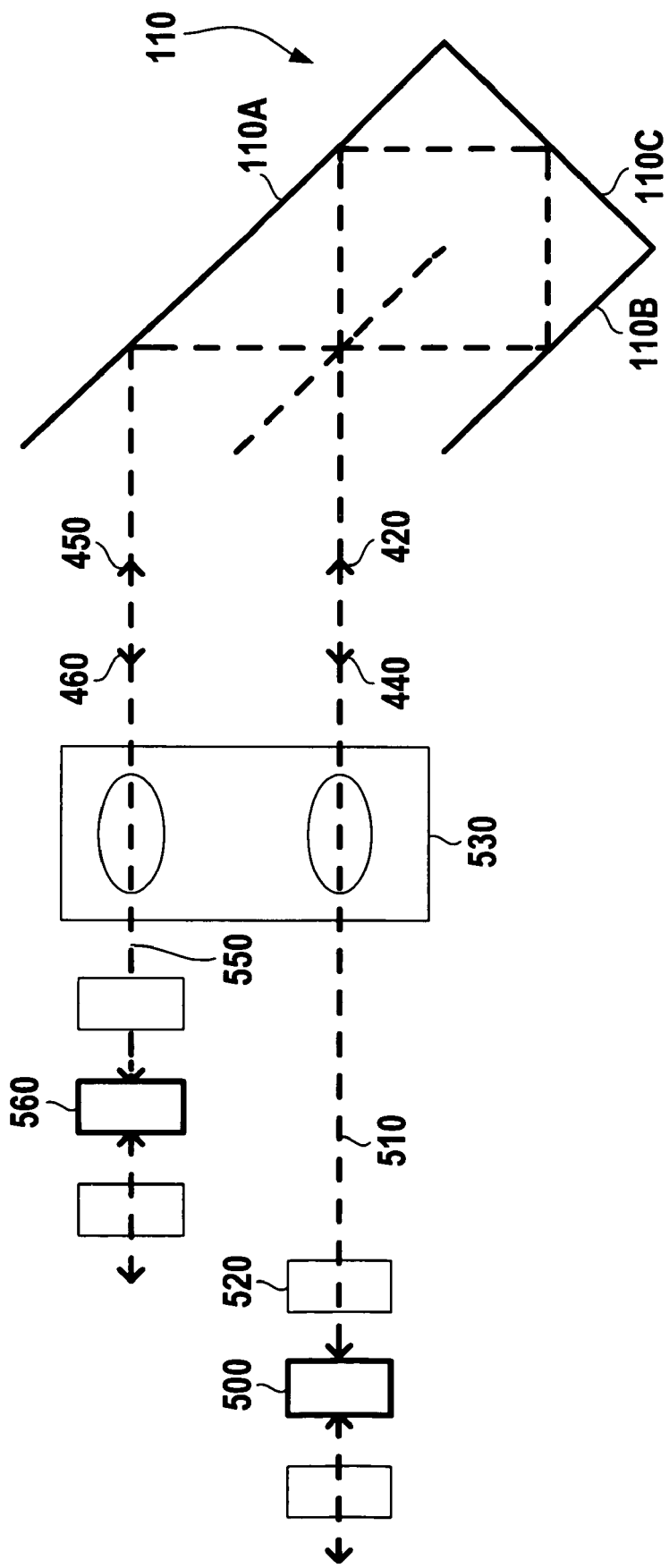

FIG. 5 illustrates a preferred application of the cavity 400 of FIG. 4 as retroreflecting device receiving the first 420 and the second 450 incident light beams from a wavelength filter 530 and retroreflecting the first 440 and the second 460 output beams back to the wavelength filter 530. The second beams 450 and 460 are provided parallel with the first beams 420 and 440 by further reflecting both second beams 450 and 460 at the first parallel plate 110A, as can be seen from FIG. 5. For that purpose, the first parallel plate 110A is preferably provided longer than the second parallel plate 110B. The spatial arrangement of FIG. 5 can be in accordance as illustrated in FIG. 2. However, the spatial arrangement of FIG. 5 might also be linear (i.e. fully within the drawing plane) particularly dependent on the type of the wavelength filter 530 (i.e. whether the wavelength filter 530 is a linear filter without angular directing its output beam(s) with respect to its input beam, or whether the wavelength filter 530 provides an angular displacement of its output beam(s) as e.g. provided by a grating).

In operation, a first laser 500 emits a first laser beam 510 (preferably collimated by a collimation device 520 if the emitted beam 520 is not already provided sufficiently collimated) to the wavelength filter 530. The first laser beam 510 is then wavelength filtered by the wavelength filter 530 and provided as the first incident beam 420 to the retroreflecting cavity 400. The first output beam 440 returning from the cavity 400 is again wavelength filtered (in case the wavelength filter 530 provided filtering in both directions) and directed back towards the first laser 500. An output might be provided from the first laser 500 (e.g. from its back facet as shown in FIG. 5) and/or from anywhere within the cavity provided between the laser 500 and the retroreflecting cavity 400, e.g. by means of a beam splitter (not shown in FIG. 5) preferably arranged in the path before or after the wavelength filter 530.

The same explanation applies accordingly for a second laser beam 550 provided by a second laser 560, which as also wavelength filtered by the wavelength filter 530 and retroreflected by the cavity 400.

Two wavelength filters for the two laser beams may be applied instead of the one wavelength filter 530, however in most of the cases with the drawback of requiring two components to be calibrated instead of only one.

An output common (not shown in FIG. 5) for both beams 420 and 450 (or in other words from both lasers 500 and 560) can be derived by providing (at least) one of the plates 110A, 110B or 110C to be semitransparent, so that a part of the beam hitting that plate 110 will be transmitted and can thus be coupled out. In case the retroreflecting cavity 400 is provided to be movable (e.g. for following wavelength separated beams from the wavelength filter 530 as provided for example by a grating), such common output might couple into a fiber arranged fixed with respect to the retroreflecting cavity 400 but allowing to be moved with the retroreflecting cavity 400.

Further collimation devices than the collimation device 520 might be provided accordingly in FIG. 5 dependent on the respective application. Some typical examples for applications of collimation devices are already indicated in FIG. 5 (without reference signs).

It is clear that the two lasers in FIG. 5 need not be operated concurrently. In one embodiment, the two lasers are operated at different wavelengths or wavelength bands (i.e. a range of wavelengths), whereby during a time interval only one of the lasers is operated or the only the output of one of the lasers is utilized. For changing the wavelength or the wavelength band in a successive time interval, the other laser can than be enabled. It goes without saying that in case the wavelength filter 530 provides an angular displacement dependent on the wavelength (as e.g. provided by a grating), switching from laser to laser (for providing the intended output) also requires adjusting the angular position of the cavity 400 with respect to the wavelength filter 530.

What is claimed is:

1. A method of using at least a part of a cavity for a first and at least one second laser, comprising the steps of:
   a) providing a first laser beam to the part of the cavity,
   b) splitting the first beam into a first and a second part,
   c) splitting the first part into a third and a fourth part,
   d) splitting the second part into a fifth and a sixth part,
   e) superimposing the third and the fifth part in a way causing extinguishing interference,
   f) superimposing the fourth and the sixth part in a way causing cumulative interference to provide a first resulting beam, and
   g) performing steps a) to f) with at least one second laser beam to provide a second resulting beam.

2. The method of claim 1, further comprising:
   letting each first part travel the same path as each second part but in opposite directions.

3. The method of claim 1, further comprising:
   performing steps a) to f) for each laser beam at the same point.

4. The method of claim 1, further comprising:
   performing step a) for both laser beams at the same point.

5. The method of claim 1, further comprising:
   selecting at least one mode of the laser by filtering at least one of the first and the second part at least one time.

6. The method of claim 5, further comprising the steps of:
   selecting at least one mode of the laser by filtering at least one of the first and the second part two times.

7. A method of using at least a part of a cavity for at least two laser beams, the part comprising a path for the laser beams constituting a closed loop, comprising:
   providing the at least two laser beams to different sides of a beam splitter;
   splitting each laser beam into a first and a second part using the beam splitter;
   letting the parts of the first laser beam travel the closed loop in opposite directions, and
   letting the parts of the second laser beam travel the closed loop in opposite directions.

8. A method of using a beam splitter, comprising the steps of:
   a) providing a laser beam along a first direction,
   b) splitting the beam into a first part leaving the beam splitter along a second direction and a second part leaving the beam splitter along a third direction
   c) guiding the first part back to the beam splitter to hit the beam splitter along the opposite direction of the third direction and guiding the second part back to the beam splitter to hit the beam splitter along the opposite direction of the second direction,
   d) superimposing both parts in a way causing extinguishing interference along the opposite direction of the second direction and causing positive interference along the opposite direction of the first direction.

9. An apparatus for using at least a part of a cavity for a first and at least one second laser, comprising:
   a beam splitter being an element of the part of the cavity for
   a) splitting a first beam provided to the beam splitter into a first and a second part,
   b) splitting the first part into a third and a fourth part,
   c) splitting the second part into a fifth and a sixth part,
   d) superimposing the third and the fifth part in a way causing extinguishing interference,
   e) superimposing the fourth and the sixth part in a way causing cumulative interference to provide a first resulting beam, and
   for performing steps a) to e) with the at least one second laser beam provided to the beam splitter to provide a second resulting beam.

10. The apparatus of claim 9, further comprising:
    at least three mirrors as elements of the part of the cavity for constituting a closed loop together with the beam splitter for letting each first part travel the same path as each second part but in opposite direction.

11. The apparatus of claim 9, further comprising:
    a filter for selecting at least one mode of the laser by filtering the first and/or the second part at least one time.

12. The apparatus of claim 9, further comprising:
    a second beam splitter being an element of the part of the cavity for coupling out low source spontaneous emission laser light out of the loop.

13. An apparatus of using a beam splitter, comprising:
    a laser source for providing a laser beam along a first direction,
    the beam splitter splitting the beam into a first part leaving the beam splitter along a second direction and a second part leaving the beam splitter along a third direction,
    a laser guide guiding the first part back to the beam splitter to hit the beam splitter along the opposite direction of the third direction and guiding the second part back to the beam splitter to hit the beam splitter along the opposite direction of the second direction, and
    the beam splitter superimposing both parts in a way causing extinguishing interference along the opposite direction of the second direction and causing positive interference along the opposite direction of the first direction.

14. An optical arrangement comprising:
    a beam splitter adapted to receive a first incident beam from a first direction and a second incident beam from a second direction different from the first direction, and
    three plates with two plates being arranged parallel to each other and the third plate being perpendicular to the two parallel plates,
    wherein the beam splitter is adapted to split up the first incident beam into two partial beams, each being at least partly reflected by each of the three plates, so that both partial beams travel substantially the same path but with opposite directions and constructively interfere to a first incident beam, and
    wherein the beam splitter is adapted to split up the second incident beam into two partial beams, each being at least partly reflected by each of the three plates, so that both partial beams travel substantially the same path but with opposite directions and constructively interfere to a second output beam propagating parallel to but with opposite direction than the second incident beam.

15. The optical arrangement of claim 14, wherein a splitting ratio of the beam splitter is adjusted that other output beams than the first or second output beams are canceled by destructive interference.

16. The optical arrangement of claim 14, wherein a splitting ratio of the beam splitter is adjusted to substantially 50:50, so that each incident beam is divided into substantially equal partial beams.

17. The optical arrangement of of claim 14, wherein one of the two parallel plates is provided in a way to reflect the second incident beam before reaching the beam splitter and to reflect the second output beam after passing the beam splitter, so that the two incident beam reach the optical arrangement in parallel and the two output beams leave the optical arrangement in parallel.

18. A laser arrangement comprising:

a first laser device adapted for emitting a first laser beam to a wavelength filter for wavelength filtering the first laser beam and directing the wavelength filtered first laser beam to an optical arrangement according to claim 14, wherein the wavelength filtered first laser beam is received by the optical arrangement as its first incident beam and retroreflected as its first output beam back towards the wavelength filter, and a second laser device adapted for emitting a second laser beam to the wavelength filter for wavelength filtering the second laser beam and directing the wavelength filtered second laser beam to the optical arrangement, wherein the wavelength filtered second laser beam is received by the optical arrangement as its second incident beam and retroreflected as its second output beam back towards the wavelength filter.

* * * * *